(12) United States Patent
Neudecker et al.

(10) Patent No.: US 10,228,404 B2
(45) Date of Patent: Mar. 12, 2019

(54) STATOR FOR AN ELECTRIC MOTOR HAVING RESPECTIVE ANGLED SLOTS

(71) Applicant: Bayerische Motoren Werke Aktiengesellschaft, Munich (DE)

(72) Inventors: Rupert Neudecker, Munich (DE); Dominik Kerler, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 169 days.

(21) Appl. No.: 15/336,984

(22) Filed: Oct. 28, 2016

(65) Prior Publication Data

US 2017/0045566 A1 Feb. 16, 2017

Related U.S. Application Data

(63) Continuation of application No. PCT/EP2015/057328, filed on Apr. 2, 2015.

(30) Foreign Application Priority Data

Apr. 30, 2014 (DE) .................. 10 2014 208 146

(51) Int. Cl.
*G01R 31/00* (2006.01)
*G01R 19/165* (2006.01)
*G01R 19/00* (2006.01)

(52) U.S. Cl.
CPC ..... *G01R 31/007* (2013.01); *G01R 19/16571* (2013.01); *G01R 19/0084* (2013.01); *G01R 19/0092* (2013.01)

(58) Field of Classification Search
CPC .... G01R 31/00; G01R 31/005; G01R 31/006; G01R 31/007; G01R 31/008; G01R 27/00;

(Continued)

(56) References Cited

U.S. PATENT DOCUMENTS 5,332,973 A * 7/1994 Brown ............... G01R 31/3004
324/500
6,476,522 B1 * 11/2002 Hays .................... G01F 1/8436
307/140

(Continued)

FOREIGN PATENT DOCUMENTS

DE 103 26 594 A1 12/2004
DE 10 2004 053 238 A1 5/2006

(Continued)

OTHER PUBLICATIONS

International Search Report (PCT/ISA/210) issued in PCT Application No. PCT/EP2015/057328 dated Sep. 22, 2015 with English translation (five pages).

(Continued)

*Primary Examiner* — Hoai-An D. Nguyen
(74) *Attorney, Agent, or Firm* — Crowell & Moring LLP

(57) ABSTRACT

A method and a corresponding device are provided for recognizing a faulty quiescent current behavior of a vehicle, in particular for identifying a quiescent current threshold value for an electrical on-board network of a vehicle. The method includes the identifying of a plurality of quiescent current data sets of a corresponding plurality of vehicles. A quiescent current data set of a vehicle includes a quiescent current measured value of the vehicle and a value for one or a plurality of vehicle parameters of the vehicle. The method furthermore includes the identifying of a plurality of classes via cluster analysis of the plurality of quiescent current data sets. A class includes a vehicle group which is described by one or a plurality of values for one or a plurality of vehicle parameters, and a class-quiescent current for the vehicle group. The method determines a quiescent current threshold value based on at least one of the class-quiescent currents of the plurality of classes.

10 Claims, 2 Drawing Sheets

(58) Field of Classification Search
CPC ........ G01R 27/02; G01R 27/08; G01R 19/00;
G01R 19/0084; G01R 19/0092; G01R
19/16571; F02D 19/0623; F16H 61/12;
G05B 23/0218; G05B 23/0275; G05B
23/0283; G01M 15/04; B60W 50/0205
USPC ....... 324/500, 503, 512, 522, 600, 649, 691,
324/713, 715, 718; 701/1, 31.6, 31.8,
701/31.9, 33.3; 702/1, 57, 64
See application file for complete search history.

(56) References Cited

U.S. PATENT DOCUMENTS

| | | | |
|---|---|---|---|
| 7,096,140 B2 * | 8/2006 | Nozuyama | G01R 31/3008 438/16 |
| 7,301,347 B2 * | 11/2007 | Dearn | G01R 19/0092 324/522 |
| 7,973,535 B2 * | 7/2011 | Lewinski | G01R 31/025 324/509 |
| 8,526,252 B2 * | 9/2013 | Li | G11C 11/16 365/200 |
| 2011/0098877 A1 | 4/2011 | Staehlin et al. | |
| 2013/0193753 A1 | 8/2013 | Brey | |
| 2017/0363392 A1 * | 12/2017 | Halter | F41G 7/001 |

FOREIGN PATENT DOCUMENTS

| | | |
|---|---|---|
| DE | 10 2006 043 419 A1 | 4/2008 |
| DE | 10 2006 052 318 A1 | 5/2008 |
| DE | 10 2007 026 165 A1 | 12/2008 |
| DE | 10 2007 031 304 A1 | 1/2009 |
| DE | 10 2008 061 304 A1 | 7/2009 |
| DE | 10 2008 042 121 A1 | 3/2010 |
| DE | 10 2010 042 432 A1 | 4/2012 |

OTHER PUBLICATIONS

German-language Written Opinion (PCT/ISA/237) issued in PCT Application No. PCT/EP2015/057328 dated Sep. 22, 2015 (six pages).

German Search Report issued in counterpart German Application No. 10 2014 208 146.7 dated Jan. 8, 2015 with partial English translation (12 pages).

* cited by examiner

STATOR FOR AN ELECTRIC MOTOR HAVING RESPECTIVE ANGLED SLOTS

CROSS REFERENCE TO RELATED APPLICATIONS

This application is a continuation of PCT International Application No. PCT/EP2015/057328, filed Apr. 2, 2015, which claims priority under 35 U.S.C. § 119 from German Patent Application No. 10 2014 208 146.7, filed Apr. 30, 2014, the entire disclosures of which are herein expressly incorporated by reference.

BACKGROUND AND SUMMARY OF THE INVENTION

The invention relates to a method and to a corresponding apparatus for identifying an erroneous quiescent current behavior by a vehicle.

Vehicles (particularly road and/or motor vehicles, such as e.g. automobiles, trucks or motorcycles) typically have a battery for storing electric power. Electric power from the battery is used to operate selected electrical loads (e.g. a warning system for theft prevention or a keyless entry function of the vehicle) even in the idle state of the vehicle. Therefore, even in the idle state of the vehicle, the battery provides what is known as a quiescent current.

An increased quiescent current can result in the charge level of the battery falling after the vehicle has been standing for a period of time to the extent that the vehicle may no longer be able to be started. For this reason, it is advantageous to detect in a reliable manner a situation in which there is an erroneously increased quiescent current in order to be able to initiate countermeasures at an early stage.

Therefore, the present document is concerned with the technical object of detecting the presence of a quiescent current error in a reliable manner.

This and other objects are achieved in accordance with the embodiments of the invention.

According to one aspect, a method for determining a quiescent current threshold value for a vehicle electrical system of a vehicle (e.g. for a road vehicle, such as an automobile, a truck or a motorcycle) is described. The quiescent current threshold value can be used to identify a quiescent current error. The vehicle electrical system of a vehicle typically includes an energy store for electric power (e.g. a rechargeable battery). The energy store can provide electric power for one or more electrical loads of the vehicle electrical system. In this case, the quiescent current of the vehicle typically includes the current (or corresponds to the current) that is needed for the operation of one or more electrical loads of the vehicle in an idle state of the vehicle (particularly when an engine of the vehicle is switched off and/or when a vehicle is locked). Exemplary electrical loads that give rise to a quiescent current are a theft warning system and/or a keyless entry function (also known by the name "convenient entry") of the vehicle.

The method comprises the determination of a multiplicity of quiescent current data records of a corresponding multiplicity of vehicles. The vehicles are typically different vehicles. The different vehicles can have different properties and/or operating states. The properties and/or operating states of a vehicle can be described on the basis of one or more vehicle parameters.

The quiescent current data record of a vehicle can particularly include a quiescent current measured value of the vehicle and at least one value for one or more vehicle parameters of the vehicle. The quiescent current measured value can be captured by a sensor (e.g. by a battery sensor) of the vehicle.

The one or more vehicle parameters of a vehicle can describe one or more properties and/or states of the vehicle. The values for the one or more vehicle parameters may be stored in a memory unit of the vehicle, and can thus be provided together with the quiescent current measured value of the vehicle as a quiescent current data record. By way of example, the one or more vehicle parameters can include information about one or more of: a manufacturer of the vehicle, a type of the vehicle, a series of the vehicle, features of the vehicle (e.g. the presence of a keyless entry function), an ambient temperature of the vehicle (e.g. an average ambient temperature), a humidity in surroundings of the vehicle (e.g. an average humidity) and/or a region (e.g. a cold region or a hot region) in which the vehicle is operated.

Hence, a multiplicity of quiescent current data records can be determined during the operation of a multiplicity of vehicles. Given a relatively large number of quiescent current data records and/or a relatively broad differentiation of vehicles, it is thus possible to provide a statistically relevant overview of the quiescent currents of vehicles.

The method further comprises the determination of a multiplicity of classes by cluster analysis of the multiplicity of quiescent current data records. In other words, on the basis of the multiplicity of quiescent current data records, it is possible for a classifier to be determined. This can be accomplished by using a cluster algorithm and/or a classification method and/or a machine learning method. A class from the multiplicity of classes comprises a vehicle group, which is described by one or more values for one or more vehicle parameters, and a class quiescent current for the vehicle group. Typically, the cluster analysis combines measured values into different classes. From the values of the one or more vehicle parameters of the quiescent current data records, it is possible to determine the vehicle group of a class. Furthermore, from the quiescent current measured values of the quiescent current data records, it is possible to determine the class quiescent current of the class (e.g. as a mean value of the quiescent current measured values).

For determination of the classifier, the cluster analysis can take into consideration one or more conditions. In particular, a predefined number of classes can be stipulated. Alternatively or additionally, a predefined difference between the class quiescent currents of different classes (i.e. a predefined distance between the classes) can be stipulated. This allows the classifier to be matched to the respective circumstances of a set of vehicles that is to be examined.

The method further comprises the determination of a quiescent current threshold value on the basis of at least one of the class quiescent currents of the multiplicity of classes. In this case, the determination can include particularly multiplication of a class quiescent current by a predefined factor. The predefined factor allows the sensitivity of a method for detecting a quiescent current error to be adjusted.

The method described allows quiescent current threshold values for different vehicles to be determined in a precise and differentiated manner. On the basis of the quiescent current threshold values determined in this manner, it is possible for the presence of a quiescent current error in the vehicle electrical system of a vehicle to be detected in a reliable manner.

According to a further aspect, a method for identifying a quiescent current error in a vehicle electrical system of a first vehicle is described. The method includes the determination of one or more first values of one or more vehicle parameters of the first vehicle. On the basis of the first values of the one or more vehicle parameters, it is possible to describe properties and/or states of the first vehicle.

Furthermore, a classifier having a multiplicity of classes can be provided. The classifier may have been determined on the basis of the methods described in this document. In this case, a class of the classifier may include a vehicle group that is described by one or more values of one or more vehicle parameters. Moreover, a class may include a class quiescent current for the relevant vehicle group. The classifier may be configured to assign a respective class quiescent current to a vehicle group. In other words, the classifier can provide a vehicle that is covered by a particular vehicle group with the quiescent current that is to be expected for this vehicle (as the class quiescent current of the particular vehicle group).

The method further comprises the determination of a first vehicle group of the first vehicle on the basis of the classifier and on the basis of the one or more first values of the one or more vehicle parameters of the first vehicle. In particular, the first vehicle can be assigned to a first vehicle group on the basis of the one or more first values of the one or more vehicle parameters. This can involve that vehicle group of the classifier whose values for the one or more vehicle parameters come closest to the first values (e.g. on average) being selected.

Moreover, the method comprises the determination of a first quiescent current threshold value for the first vehicle on the basis of the class quiescent current of the first vehicle group. In particular, this can be accomplished by multiplying the class quiescent current of the first vehicle group by a predefined factor.

Furthermore, the method comprises the identification of a quiescent current error in the first vehicle on the basis of the first quiescent current threshold value. This can be accomplished by determining a present quiescent current of the first vehicle. The present quiescent current can then be compared with the first quiescent current threshold value. A present quiescent current that reaches or exceeds the first quiescent current threshold value may be an indication of the presence of a quiescent current error.

As already explained above, the determination of the quiescent current threshold value on the basis of a classifier can ensure that quiescent current errors can be detected in a reliable manner.

The method may further comprise the initiation of a measure for correcting the quiescent current error when a quiescent current error has been identified. Exemplary measures are setting an error memory entry, outputting an error report and/or notifying the vehicle keeper and/or the garage via a telecommunication service.

According to a further aspect, a control unit for a vehicle is described. The control unit may be configured to perform a method as described herein. Alternatively or additionally, the control unit may be configured to determine an indicator of a quiescent current of a vehicle electrical system of the vehicle (e.g. using a sensor of the vehicle). The control unit may further be configured to transmit the determined indicator of the quiescent current via a communication unit (particularly via a wireless communication unit) of the vehicle to a unit outside the vehicle. In particular, the indicator of the quiescent current can be provided as a quiescent current data record for determination of a classifier. The control unit can therefore help to provide quiescent current data records from the operation of the vehicle for a central unit for determination of the classifier.

The control unit may further be configured to receive a quiescent current threshold value (e.g. via a wireless communication unit of the vehicle). On the basis of the quiescent current threshold value, it is then possible for the presence of a quiescent current error to be identified. As such, it may be possible for an updated classifier to be taken as a basis for updating and providing quiescent current threshold values. This allows improved identification of quiescent current errors.

According to a further aspect, a vehicle (e.g. an automobile, a truck or a motorcycle) is described that includes a control unit as described herein.

According to a further aspect, a software (SW) program is described. The SW program can be configured to be executed on a processor (e.g. on a controller of a vehicle) and, as result, to perform a method as described herein.

According a further aspect, a storage medium is described. The storage medium may comprise an SW program that is configured to be executed on a processor and, as result, to perform a method as described herein.

It should be noted that the methods, apparatuses and systems described in this document can be used either on their own or in combination with other methods, apparatuses and systems described in this document. Furthermore, all aspects of the methods, apparatuses and systems described in this document can be combined with one another in many and diverse ways.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
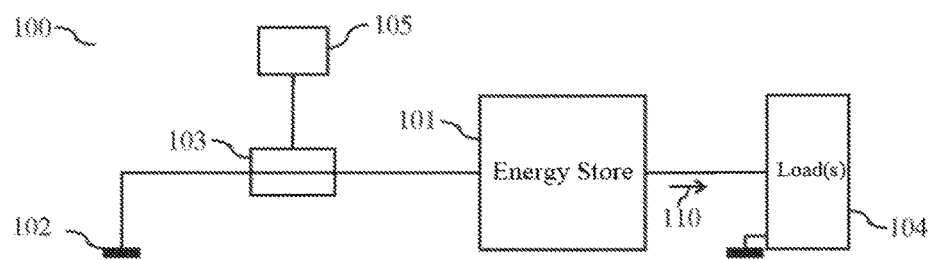
FIG. 1 is a schematic block diagram of selected components of a vehicle.

As explained at the outset, the invention is concerned with the detection of an erroneously increased quiescent current. In this context, FIG. 1 shows a block diagram of exemplary components of a vehicle 100. In particular, FIG. 1 shows an energy store 101 for electric power (particularly a rechargeable battery, for example a low voltage battery, at an operating voltage of approximately 12 V). One pole of the energy store 101 is typically connected to a ground 102 of the vehicle 100. A further pole of the energy store 101 is used to provide a current 110 for one or more electrical loads 104 of the vehicle 100. When the vehicle 100 is in an idle state, the energy store 101 provides a quiescent current 110.

The vehicle 100 further includes a sensor 103 (e.g., what is known as an "intelligent battery sensor, IBS") that is configured to capture measurement data for a state of the energy store 101. The measurement data can include in particular information (e.g. an indicator) regarding the quiescent current 110. For this purpose, FIG. 1 shows an exemplary connection between battery sensor 103 and the negative pole of the energy store 101. If need be, the sensor 103 may also be connected to the positive pole of the energy store 101 (not shown). Furthermore, the measurement data can include information regarding a temperature of the energy store 101 and/or regarding a charge level of the energy store 101.

Furthermore, the vehicle 100 includes a control unit 105 that is configured to receive and process the measurement data of the sensor 103. In particular, the control unit 105 may be configured to compare the indicator of the quiescent current 110 with a quiescent current threshold value. This comparison allows determination of an indication that there is an erroneously increased quiescent current. In particular, there may be an indication of a quiescent current error if the indicator of the quiescent current 110 reaches or exceeds the quiescent current threshold value.

Figure 2:
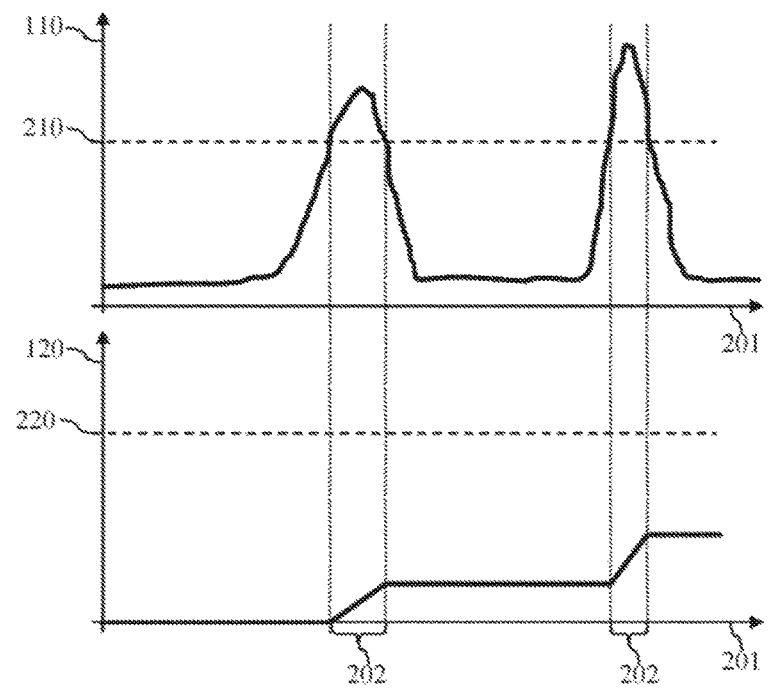
FIG. 2 is a graph of an exemplary profile of the quiescent current of a vehicle.

FIG. 2 shows an exemplary profile of the quiescent current 110 of a vehicle 100 over time 201. The profile shown for the quiescent current 110 has current peaks at which the quiescent current 110 exceeds the predefined quiescent current threshold value 210. The control unit 105 may be configured to detect intervals 202 in which the quiescent current 110 exceeds the quiescent current threshold value 210. Furthermore, the control unit 105 may be configured to determine a cumulative error current 120 and/or a cumulative error energy 120. To this end, the actual quiescent current 110 in the intervals 202 (or the electric power provided in the intervals 202) can be accumulated. A quiescent current error can be detected when the cumulative quiescent current 120 (or the cumulative energy 120) reaches or exceeds a threshold value 220. By taking into consideration the cumulative quiescent current 120, it is possible to increase the robustness of detection of a quiescent current error. In particular, it is possible to prevent a single exceeding of the quiescent current threshold value 210 (e.g. on account of an isolated effect) from leading to detection of a quiescent current error.

The control unit 105 may be configured to initiate measures (e.g. output of an error report) when the cumulative quiescent current 120 reaches or exceeds the threshold value 220, and/or when the quiescent current 110 reaches or exceeds the quiescent current threshold value 210.

As explained above, the exceeding of the quiescent current threshold value 210 can be assessed as an indication of the presence of a quiescent current error. In this case, the reliability of this indication of the presence of a quiescent current error is dependent particularly on the level of the quiescent current threshold value 210. In order to avoid misdetections, the quiescent current threshold value 210 should be above a largest possible quiescent current (including component and/or measurement tolerances) that is possible in vehicles 100 in the normal state. On the other hand, a high quiescent current threshold value 210 results in only significant quiescent current errors being able to be identified, for which the quiescent current 110 exceeds the relatively high quiescent current threshold value 210.

For this reason, subtle quiescent current errors (e.g. a quiescent current of 30 mA instead of, regularly, 10 mA) are, in most cases, unable to be identified at all or can be identified only after relatively long battery discharge. This can lead to battery breakdowns and/or to severe discharge with possible premature damage to the energy store 101.

This document describes a method that can be used to determine a quiescent current threshold value 210 for a vehicle 100 in a precise manner. This allows reliability for the detection of a quiescent current error to be increased.

Figure 3:
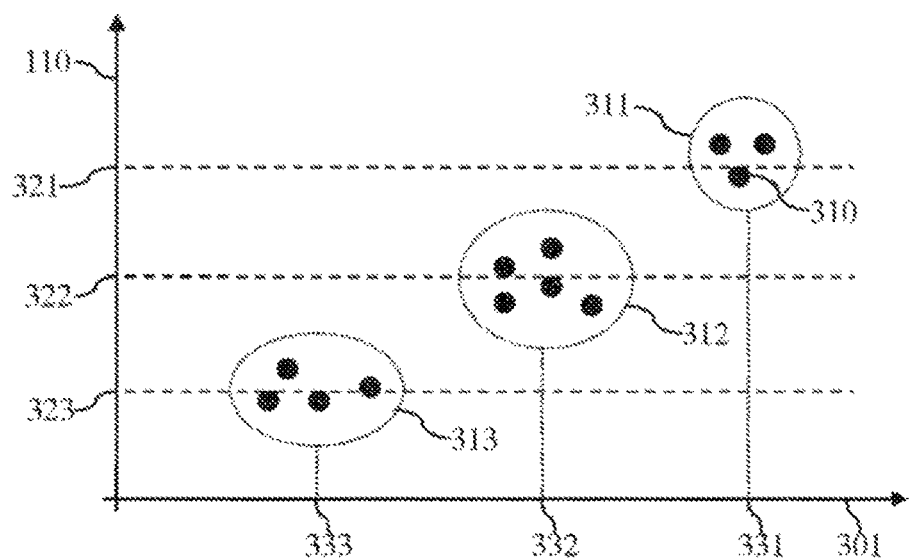
FIG. 3 is a graph of an exemplary cluster analysis of quiescent current data records.
Figure 4:
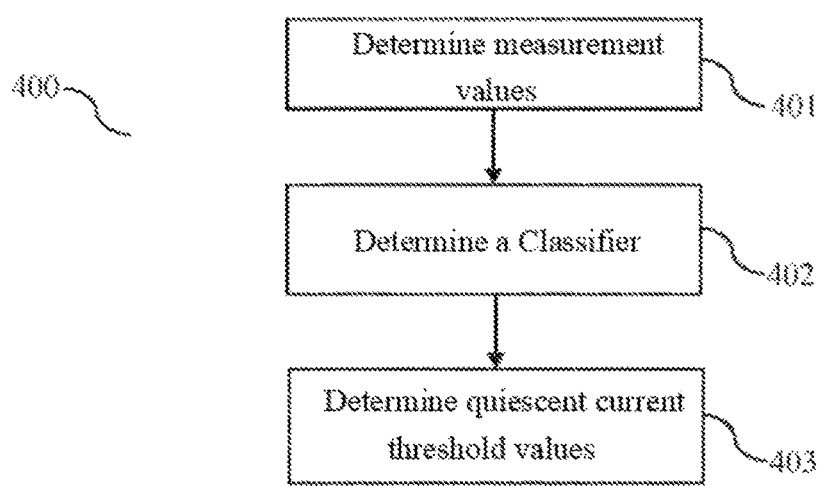
FIG. 4 is a flowchart of an exemplary method for determining a quiescent current threshold value.

FIG. 4 shows a flowchart of an exemplary method 400 for determining a quiescent current threshold value 210. The method 400 is described with reference to FIG. 3. The method 400 includes the determination 401 of a multiplicity of quiescent current data records 310. The quiescent current data records 310 can be determined for a multiplicity of different vehicles 100. The vehicles 100 may be configured to capture the respective quiescent currents 110 via the sensor 103 during operation. The captured quiescent currents 110 can then be provided for a central unit (e.g. a server) as quiescent current data records 310. By way of example, the quiescent current data record(s) 310 of a vehicle 100 can be transmitted via a wireless communication network from the vehicle 100 to the central unit. Alternatively or additionally, the quiescent current data record(s) 310 can be stored in a memory unit of the vehicle 100. The quiescent current data record(s) 310 can then be read as required (e.g. during maintenance of the vehicle 100) and provided for the central unit.

The determination 401 of the multiplicity of quiescent current data records 310 can include the collection of field data of a multiplicity of vehicles 100. The multiplicity of quiescent current data records 310 can therefore include actually measured quiescent currents 110 (referred to in this document as quiescent current measured values). The quiescent currents 110 can be captured by the sensor 103 during one or more (e.g. all) idle phases of a vehicle 100. The captured quiescent currents 110 can be averaged over time 201, if need be, in order to determine an average quiescent current 110. When the vehicle 100 is started, the determined quiescent current(s) 110 can be stored in the memory unit and/or transmitted to the central unit.

A quiescent current measured value may be associated with one or more vehicle parameters 301. In this case, the one or more vehicle parameters 301 of a quiescent current measured value typically include one or more properties of the vehicle 100 for which the quiescent current measured value has been determined. The one or more vehicle parameters 301 can include e.g., one or more of the following parameters:

a vehicle type (described e.g. by a manufacturer name, a model designation, a year of production, a type designation, etc.);

the presence of one or more special features of the vehicle 100; and/or a country/a region in which the vehicle 100 is operated. This can particularly have an influence on an ambient temperature, on humidity, on the use of road salt, etc.

One quiescent current data record 310 from the multiplicity of quiescent current data records 310 can therefore comprise a vector of data, wherein the vector includes, as vector components, a quiescent current measured value and values of one or more vehicle parameters 301. In this case, the quiescent current measured value reproduces a measured quiescent current 110 of a vehicle 100, and the values of the one or more vehicle parameters 301 reproduce properties or the states of the vehicle 100 for which the quiescent current measured value has been determined.

The method 400 further includes the determination 402 of classes 311, 312, 313 on the basis of the multiplicity of quiescent current data records 310. A class 311, 312, 313 comprises quiescent current data records 310 that have similar quiescent current measured values and similar forms (i.e. values) of the one or more vehicle parameters 301. The classes 311, 312, 313 can be determined from the multiplicity of quiescent current data records 310, e.g., on the basis of a cluster algorithm and/or on the basis of a classification analysis (e.g. on the basis of a minimal tree method).

A class 311, 312, 313 can be described particularly by a vehicle group 331, 332, 333, wherein the vehicle group 331, 332, 333 includes one or more values of the one or more vehicle parameters 301 of vehicles 100 that have similar quiescent currents 110. In other words, a vehicle group 331, 332, 333 describes the properties or states of vehicles 100 that have similar quiescent currents 110. Furthermore, a class 311, 312, 313 comprises a class quiescent current 321, 322, 323. The class quiescent current 321, 322, 323 can be determined on the basis of the quiescent current measured values of the quiescent current data records 310 that are covered by the relevant class 311, 312, 313 (e.g. as a mean value of the quiescent current measured values).

The method 400 can therefore include the generation 402 of a classifier on the basis of the multiplicity of quiescent current data records 310. The classifier is configured to associate a particular vehicle 100 with a vehicle group 331, 332, 333. A vehicle group 331, 332, 333 can be described particularly by a particular form (i.e. by particular values) of one or more vehicle parameters 301. The particular vehicle 100 can be associated with a particular vehicle group 331, 332, 333 on the basis of the values of said vehicle for the one or more vehicle parameters 301. A vehicle group 331, 332, 333 is associated with a relevant class quiescent current 321, 322, 323 via the class 311, 312, 313. The class quiescent current 321, 322, 323 of the vehicle group 331, 332, 333 with which the particular vehicle 100 is associated can then be used to determine the quiescent current threshold value 110 for the particular vehicle 100.

The classes 311, 312, 313 can be determined such that the class quiescent currents 321, 322, 323 have a predefined distance value (a predefined quiescent current difference) in relation to one another. The predefined distance value can be taken into consideration for the cluster formation, i.e. for the formation of the classes 311, 312, 313. Furthermore, the cluster formation can involve a number of classes 311, 312, 313 being prescribed.

As explained above, a class 311, 312, 313 is described by a relevant vehicle group 331, 332, 333. Exemplary vehicle groups 331, 332, 333 are presented in table 1. As table 1 reveals, a vehicle group 331, 332, 333 can include multiple values for a vehicle parameter 301. Furthermore, a vehicle group 331, 332, 333 may possibly apply to all forms of a vehicle parameter 301.

TABLE 1

| Vehicle group | Type | Special features | Country/region |
|---|---|---|---|
| 1 | Subcompact | Low | |
| 2 | Subcompact Compact | High | |
| 3 | 4 × 4 | | Hot country |
| 4 | 4 × 4 | | Cold country |
| 5 | | Keyless entry function | |

The method 400 can further include the determination 403 of a quiescent current threshold value 210 on the basis of the multiplicity of classes 311, 312, 313, particularly on the basis of the class quiescent currents 321, 322, 323. By way of example, the quiescent current threshold value 210 for a class 311, 312, 313 can be determined by multiplying the relevant class quiescent current 321, 322, 323 by a safety factor (e.g. by the factor two).

The quiescent current threshold values 210 determined in this manner can be used in vehicles 100 for detection of an indication of the presence of a quiescent current error. To this end, a vehicle 100 can be associated with a vehicle group 331, 332, 333 by means of the values of the one or more vehicle parameters 301 of the vehicle 100. From the vehicle group 331, 332, 333, the relevant class quiescent current 321, 322, 323 is then obtained, from which it is possible to determine the quiescent current threshold value 210 for the vehicle 100. This quiescent current threshold value 210 can be then stored in a memory unit of the vehicle 100, and used by the control unit 105 in order to determine an indication of the presence of a quiescent current error.

The method 400 allows quiescent current threshold values 210 to be determined for different vehicle types in a precise manner. The quiescent current threshold values 210 can be matched to the actual features and/or the actual operating situation of a vehicle 100. Hence, quiescent current errors can be detected in a reliable manner. Furthermore, ongoing capture of quiescent current data records 310 allows the quiescent current threshold values 210 to be matched continuously.

As already explained above, the control unit 105 may be configured to introduce measures when a quiescent current error has been detected on the basis of the measured quiescent current 110 (e.g. when a quiescent current threshold value 210 is exceeded once or repeatedly). By way of example, quiescent current errors can be detected in the factory itself and suitable countermeasures can be performed before the vehicle is delivered to the customer. Alternatively or additionally, continuous monitoring can take place during operation of a vehicle 100. When a quiescent current error is identified, an error memory entry can be made, a report can be output to a user of the vehicle 100 and/or a message can be sent (e.g. to a maintenance service or the vehicle keeper).

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for determining a quiescent current threshold value for a vehicle electrical system of a vehicle, the method comprising the acts of:
   determining a multiplicity of quiescent current data records of a corresponding multiplicity of vehicles, wherein a quiescent current data record of a vehicle comprises a quiescent current measured value of the vehicle and a value for one or more vehicle parameters of the vehicle;
   determining a multiplicity of classes by cluster analysis of the multiplicity of quiescent current data records, wherein a class comprises a vehicle group, which is described by one or more values for one or more vehicle parameters, and comprises a class quiescent current for the vehicle group; and
   determining a quiescent current threshold value based on at least one of the class quiescent currents of the multiplicity of classes.

2. The method as claimed in claim 1, wherein the one or more vehicle parameters of a vehicle:
   describe one or more properties of the vehicle; and/or
   comprise information on one or more of: a manufacturer of the vehicle, a type of the vehicle, a series of the vehicle, features of the vehicle, an ambient temperature of the vehicle, a humidity in surroundings of the vehicle or a region in which the vehicle is operated.

3. The method as claimed in claim 1, wherein the determining of the quiescent current threshold value comprises multiplication of a class quiescent current by a predefined factor.

4. The method as claimed in claim 1, wherein the cluster analysis takes into consideration one or more of the following conditions:
   a predefined number of classes;
   a predefined difference between the class quiescent currents of different classes.

5. The method as claimed in claim 1, wherein the quiescent current of a vehicle comprises a current that is needed for the operation of one or more electrical loads of the vehicle in an idle state of the vehicle.

6. A control unit for a vehicle, wherein the control unit is configured to:
   receive a quiescent current threshold value determined in accordance with the method of claim 1;
   capture an indicator for a quiescent current of a vehicle electrical system of the vehicle;
   compare the indicator of the quiescent current with the quiescent current threshold value; and
   identify the presence of a quiescent current error when the indicator of the quiescent current reaches or exceeds the quiescent current threshold value.

7. A method for identifying a quiescent current error in a vehicle electrical system of a first vehicle, the method comprising the acts of:
   determining one or more first values of one or more vehicle parameters of the first vehicle;
   providing a classifier having a multiplicity of classes, wherein a class comprises a vehicle group, which is described by one or more values of one or more vehicle parameters, and comprises a class quiescent current for the vehicle group;
   determining a first vehicle group of the first vehicle on the basis of the classifier and on the basis of the one or more first values of the one or more vehicle parameters of the first vehicle;
   determining a first quiescent current threshold value for the first vehicle on the basis of the class quiescent current of the first vehicle group; and
   identifying a quiescent current error in the first vehicle on the basis of the first quiescent current threshold value.

8. The method as claimed in claim 7, wherein the identification of a quiescent current error comprises:
   determining a present quiescent current of the first vehicle; and
   comparing the present quiescent current with the first quiescent current threshold value.

9. The method as claimed in claim 7, wherein the method further comprises:
   initiating a measure for correcting the quiescent current error when a quiescent current error has been identified.

10. The method as claimed in claim 8, wherein the method further comprises:
   initiating a measure for correcting the quiescent current error when a quiescent current error has been identified.

* * * * *